United States Patent [19]

Owen et al.

[11] Patent Number: 4,810,960
[45] Date of Patent: Mar. 7, 1989

[54] MEASURING ADJACENT CHANNEL POWER

[75] Inventors: David P. Owen, Dunstable; Donald Pearce, London, both of United Kingdom

[73] Assignee: Marconi Instruments Ltd., United Kingdom

[21] Appl. No.: 61,315

[22] Filed: Jun. 11, 1987

[30] Foreign Application Priority Data

Jun. 14, 1986 [GB] United Kingdom ............... 8614540

[51] Int. Cl.$^4$ ............................................. G01R 23/14
[52] U.S. Cl. ..................................... 324/79 R; 455/67
[58] Field of Search ................ 324/79 R, 77 B, 77 C, 324/77 CS, 475, 78 E, 77 E; 370/70; 455/155, 226, 67; 364/484, 485

[56] References Cited

U.S. PATENT DOCUMENTS 3,327,211  6/1967  Taub ..................................... 324/95
4,409,544 10/1983  Redlich ............................ 324/57 R

FOREIGN PATENT DOCUMENTS 0201692  3/1986  European Pat. Off. .
2823073 11/1979  Fed. Rep. of Germany .
3337772  4/1985  Fed. Rep. of Germany .
2034900  6/1980  United Kingdom .

OTHER PUBLICATIONS

Adjecent-Channel Power Meter NKS News From Rohde & Schwarz Brukner et al., vol. 18, No. 83, 1978.
Cable System Measurements, TV Communications by Jeff Thomas, Oct. 1977.
Transmitter Radiation Measuring Methods, Bell Telephone Tech. Pub. by N. Lund Apr. 1950.
Patent Abstracts of Japan, vol. 7, No. 6 Jan. 11, 1983.
Allen P. Edwards, "Precise, Convenient Analysis of Modulated Signals", Hewlett Packard Journal, vol. 30, No. 11 (Nov. 1979):3,9.
European Search Report - Appln. No. 87304843.3 dated 11/17/87.

Primary Examiner—Stewart J. Levy
Assistant Examiner—Louis M. Arana
Attorney, Agent, or Firm—Lowe, Price, LeBlanc, Becker & Shur

[57] ABSTRACT

A signal source from a transmitter is down-converted by being mixed with a locally generated signal so that a desired adjacent channel band is converted to base band and the adjacent channel power measured after filtering by a low pass filter. To eliminate the notch in the filter characteristics that occurs when the power is measured by a.c coupled means, the locally generated signal is modulated or swept around the center of the adjacent channel band.

20 Claims, 7 Drawing Sheets 4,810,960

MEASURING ADJACENT CHANNEL POWER

BACKGROUND TO THE INVENTION

This invention relates to adjacent channel power of signal sources. In particular it relates to a method and apparatus for measuring the adjacent channel power of, for instance, a transmitter.

It is often required to take measurements of the characteristics of a transmitter to ensure that the transmitter does not cause interference to users of adjacent channels in the radio spectrum. Measurements are taken of the amount of signal power, either in absolute terms or relative to the whole transmitted power, that a transmitter emits in the adjacent channels to the transmission channel. Adjacent channel power is usually measured over a bandwidth equivalent to that o a typical receiver, which varies upon the type of transmission i.e, single sideband (SSB), frequency modulation (FM), etc. In a typical SSB transmission the adjacent channel is nominally 2.4 kHz wide, separated by 5 kHz from the main transmission channel.

Conventionally, such measurements are made by firstly converting the transmitter signal to a suitable intermediate frequency, i.f. The signal is subsequently passed through a bandpass filter centered on the adjacent channel to be measured, and having well defined characteristics. For example, for an SSB transmitter the bandpass filter may have typically a 6 dB bandwidth of 2,400 Hz. Steep skirts are required to substantially reject signals outside the required bandwith, including of course the main transmission signal. The filter must therefore be different for each type of transmission, must be environmentally stable, and requires a very high Q. They are usually ceramic, crystal or mechanical filters. As a result they can be expensive to produce and test and a different design is required for each transmission system.

According to the present invention, there is provided a method for measuring adjacent channel power of a signal source including down converting a signal such that the adjacent channel band is converted to base band; filtering the down converted signal with a low pass filter; and measuring the power output from the low pass filter.

In practice as will be further described, the meters used to measure the power output must be a.c. coupled in order not to measure d.c. offsets from the filter and amplifiers. As is also described below this leads to an unwanted notch in the filter characteristics. To overcome this problem, the invention also provides a method for measuring adjacent channel power of a signal source including the steps of mixing an input signal with a local oscillator signal having angle modulation and which is nominally centered on the desired adjacent channel centre frequency so that the adjacent channel band is down converted to base band: filtering the down converted signal with a low pass filter; and measuring the power output from the low pass filter by means of an a.c. coupled meter.

According to a first aspect of the invention, the local oscillator is modulated by phase or frequency modulation which may be from a noise source, and the low pass filter has a frequency response substantially equal to half the adjacent channel bandwidth.

Typically the noise may be restricted in bandwidth and frequency and may for example have a 50 Hz bandwidth and a r.m.s deviation of 50 Hz.

The output signal from the low pass filter may be amplified and measured by a volt meter and a value obtained for the power, either absolute or relative, of the adjacent channel.

According to a second aspect of the invention the low pass filter may have a bandwidth significantly less than the adjacent channel bandwidth. Typically this might be 100 Hz. In this case the local oscillator frequency may be swept by a periodic waveform, such that parts of the desired adjacent channel frequency spectrum are passed in turn by the low pass filter. The periodic waveform may be a triangular wave. The output from the low pass filter may be arithmetically squared and measured by an integrating type volt meter adapted to measure the output voltage over one or more complete cycles of the local oscillator sweep waveform. The output from the volt meter is then a measure of the adjacent channel power.

DESCRIPTION OF EMBODIMENTS OF THE INVENTION

Embodiments of the invention will now be described by way of example only with reference to the accompanying drawings, in which.

Figure 1:
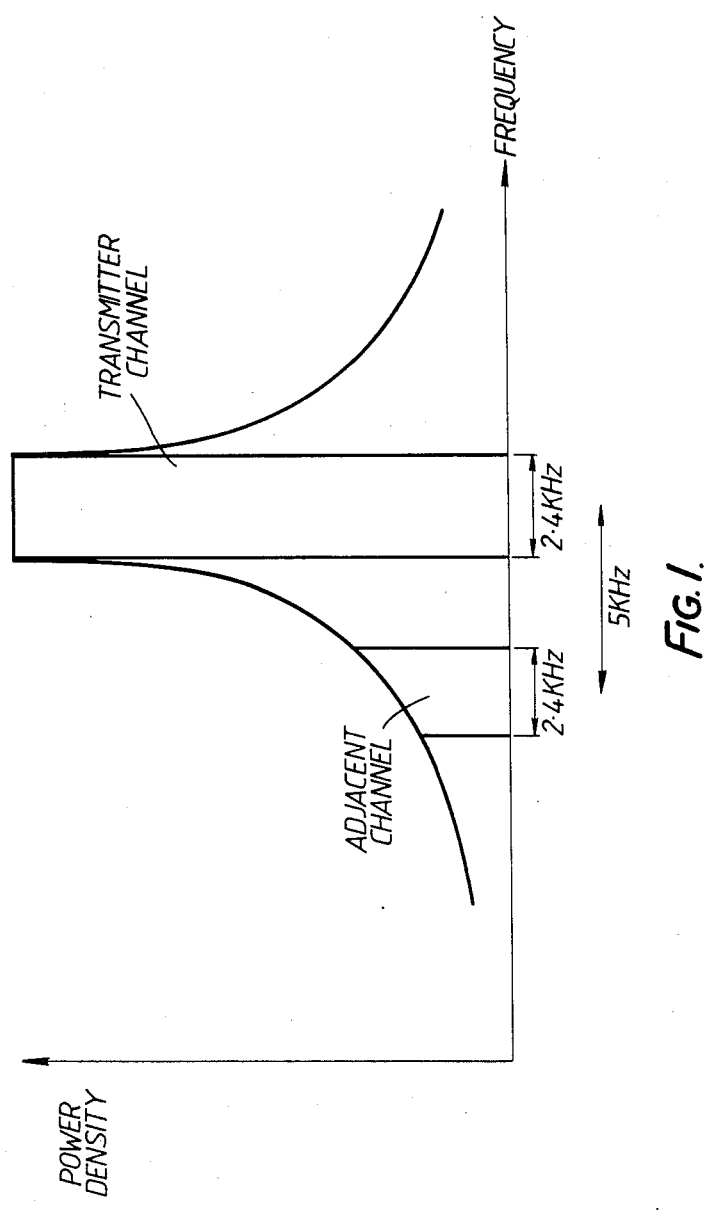
FIG. 1 shows a typical signal spectrum from a transmitter operating at a particular frequency.

A typical output spectrum from an rf transmitter is shown at FIG. 1. It is seen that although the main power is concentrated at the desired transmitter channel frequency there is still a measurable signal power at the adjacent frequencies. In a typical SSB (single side band) transmission the adjacent channel is 2.4 kHz wide and separated by 5 kHz from the transmission channel. Apparatus to measure the adjacent channel power must therefore be arranged to measure the full power in a 2.4 kHz bandwidth and to substantially reject those components of the signal outside this bandwidth.

Figure 2:
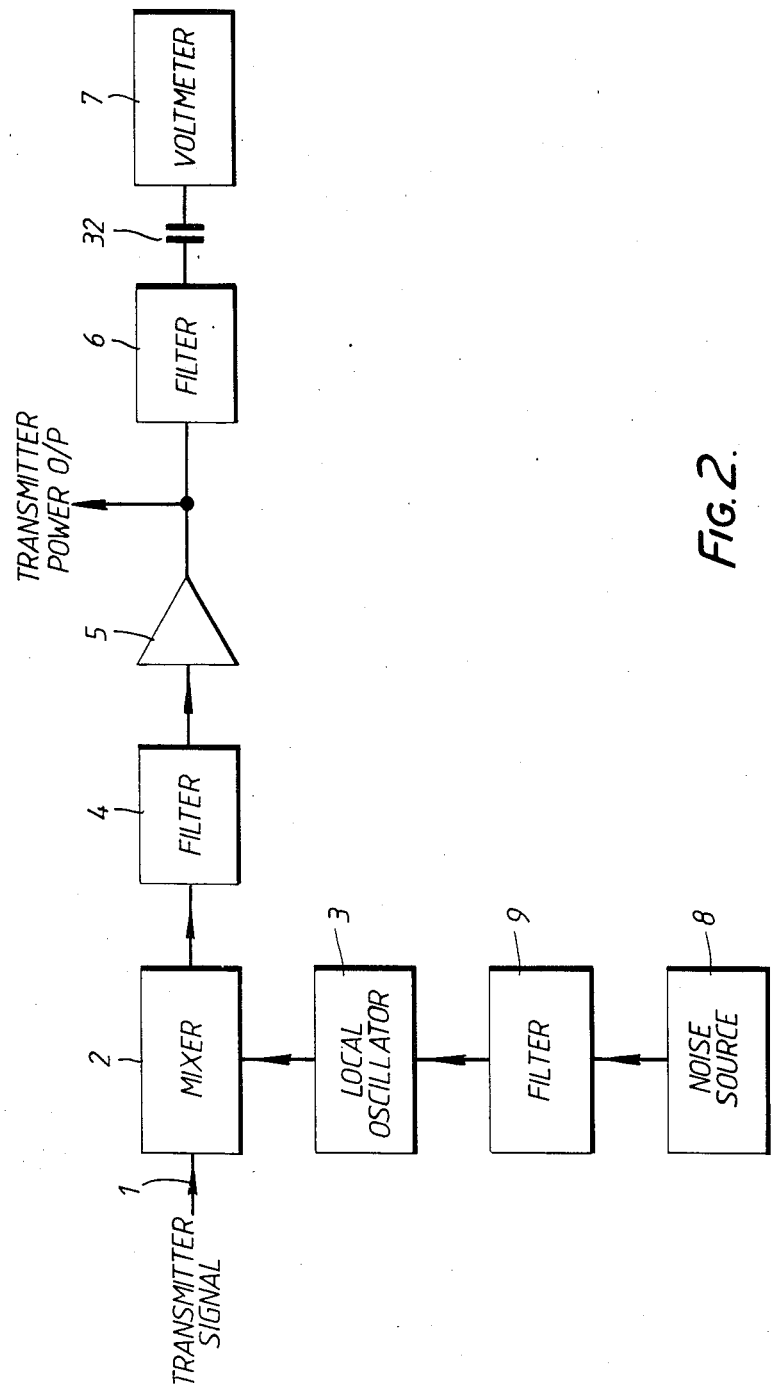
FIG. 2 shows a first apparatus according to the invention for measuring adjacent channel power.
Figure 3:
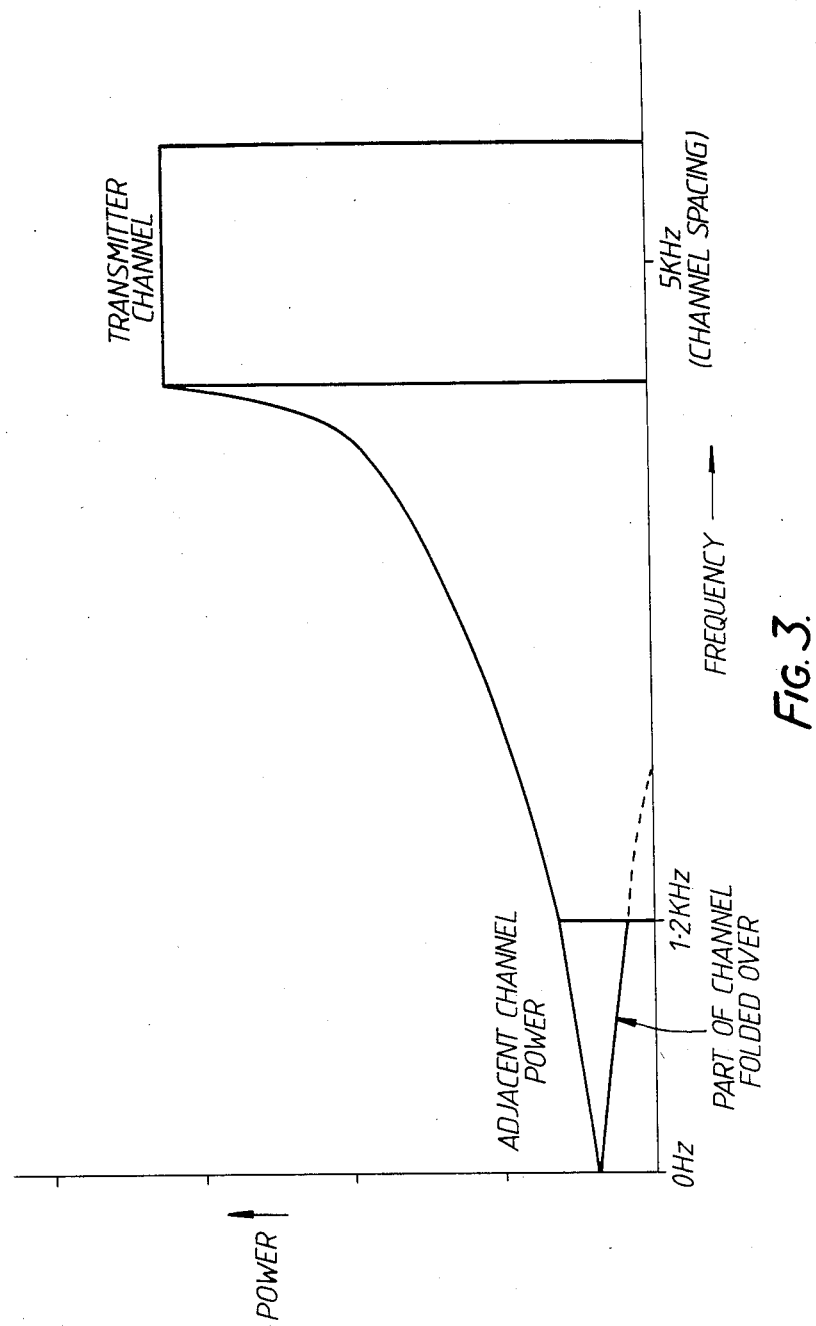
FIG. 3 shows the output spectrum after the transmitter signal has passed through the mixer stage of FIG. 2.

FIG. 2 shows one apparatus which may be used to achieve this aim. Referring to the Figure, the transmitter signal 1 is mixed in a mixer 2 with the output of an oscillator 3 whose frequency is nominally at the centre of the adjacent channel to be measured. The transmitter signal input to the mixer may be an intermediate frequency (i.f.) signal generated by frequency conversion of the transmitter signal if desired. The output from mixer 2 is filtered to remove very high frequency mixing products. If the transmitter sinai is denoted Ft and the local oscillator signal F1 then the output from the mixer Fo=Ft±F1. Filter 4 removes the high frequency component and thus the output from the filter is down-converted to a baseband signal, as is shown in FIG. 3. The main transmitter signal appears as an audio signal centered at the adjacent channel offset frequency, 5 kHz. The adjacent channel signal spectrum is "folded" over so that for an SSB transmission having a channel bandwidth of 2.4 kHz the adjacent channel power is located between 0 Hz, i.e. dc, and 1.2 kHz.

The output from filter 4 is then amplified by amplifier 5 and filtered by a low pass filter 6 having a bandwidth substantially that required by the adjacent channel filter specification. The output from filter 6 is measured by voltmeter 7.

Figure 4:
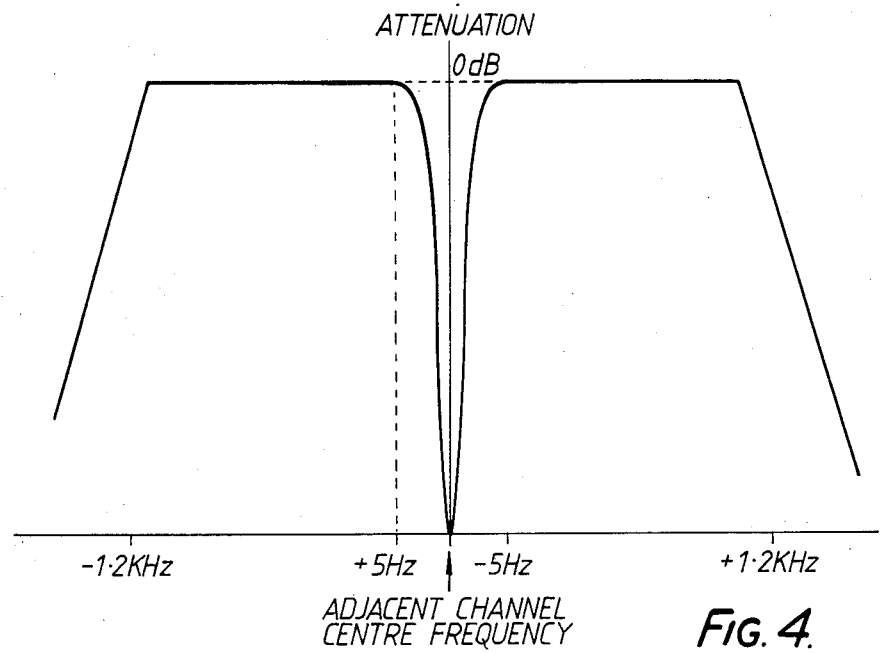
FIG. 4 shows the adjacent channel power filter response before angle modulation.

In order to avoid measuring dc offsets from mixer and amplifier stages the amplifiers used to recover the adjacent channel power from the 1.2 kHz low pass filter must be a.c. coupled. A coupling network is shown schematically in the Figure by capacitor 32. In practise, the voltmeter may include several coupling networks. The a.c. coupling results In the effective adjacent channel power filter response being as shown in FIG. 4. Due to the ac coupling there will be a notch in the filter characteristics at 0 Hz since dc is not of course transmitted. Typically, if the ac coupling networks are 3 dB down at, for example. 5 Hz, a notch with a −3 dB bandwidth 10 Hz will appear as shown. This is overcome in the first embodiment of the present invention by applying modulation to the local oscillator. This may be frequency or phase modulation.

So that it cannot be accidentally cancelled or generate aliasing effects, the angle modulation should preferably be provided by noise. In the apparatus shown it may typically be noise filtered by a low pass filter with 50 Hz bandwidth and an r.m.s deviation of 50 Hz.

Figure 5:
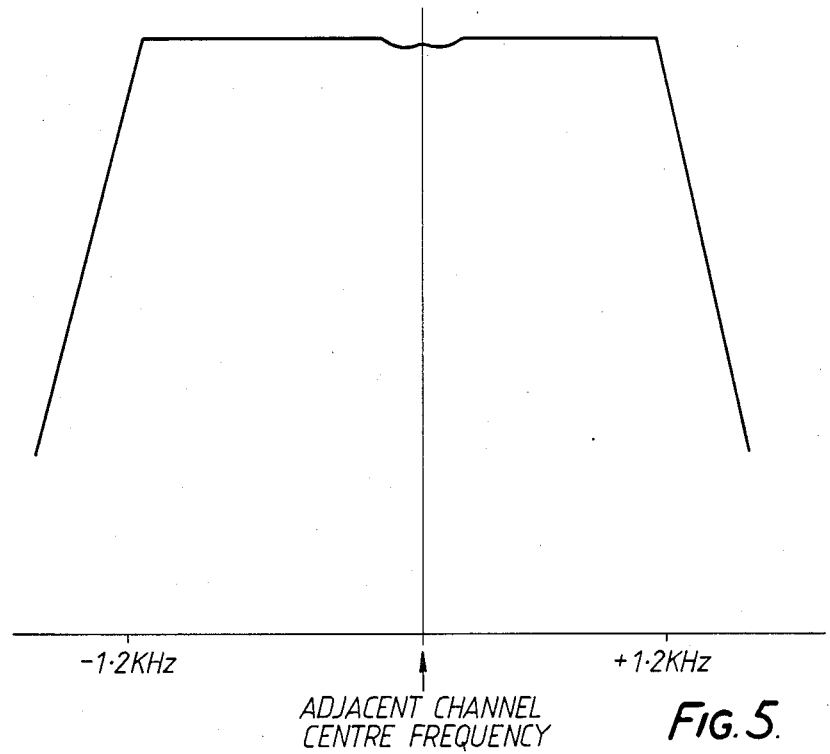
FIG. 5 shows the adjacent channel power filter response after angle modulation.

The angle modulation serves to smear out the notch in the equivalent adjacent channel power filter and leaves a slight pass band dip in the centre of the filter characteristics as shown in FIG. 5. The width and depth of the dip are controlled by the deviation of the angle modulation. Consider as an example a coherent signal which would, without angle modulation be located in the filter notch caused by the ac coupling networks. Without angle modulation, the volt meter would not respond to the signal. After angle modulation however, the down converted signal is frequency modulated and hence only spends a fraction of the time at a frequency within the notch. The volt meter will therefore measure this signal although with a slightly reduced amplitude since it does appear within the notch for a small fraction of the time. The angle modulation can be chosen such that the slight dip is well within the allowed pass band ripple of the filter and hence the resulting errors are within allowable limits.

Excessive spectral spread of the angle modulation should be avoided since spurious components may appear as sidebands on the down converted transmission channel and the products after mixing may not be rejected after the 1.2 kHz low pass filter. However this is easy to achieve since the ac coupling notch is considerably narrower than the low pass filter bandwidth. The angle modulation does have a small effect on the skirts of the filter. In an embodiment of the invention a low pass filter is implemented as a seven pole, 6 zero elliptic filter with 0.01 dB pass band ripple. This filter is of high order and therefore complex but can be implemented as an active filter, the design of which may be made by methods well known in the art.

In order to measure other types of transmission signals the apparatus may include a number of alternative low pass filters which may be switched in and out and the local oscillator frequency may be adjusted to cope with different adjacent channel bandwidths.

The voltmeter 7 measures the signal passed by low pass filter 6. In order to make an absolute measurement of adjacent power the insertion loss of the mixer and any network between the transmitter and mixer must be taken into account. It is often more useful to measure the relative adjacent channel power relative to the transmitted power. All that is required in the present apparatus is to measure the transmitted signal power before the low pass filter 6 and compare this to the adjacent channel power after the filter.

Figure 6:
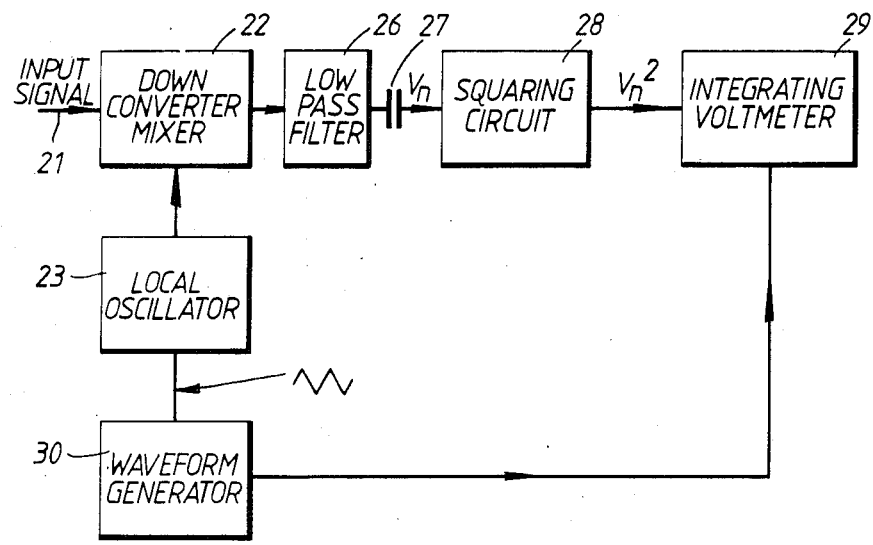
FIG. 6 shows a second apparatus for measuring adjacent channel power.

A second apparatus according to the invention for measuring adjacent channel power is shown in FIG. 6. Again, an input signal 21 is down converted in a mixer 22 by mixing with a local oscillator 23 whose frequency is set nominally to be the centre of the adjacent channel to be measured As above, in a typical SSB transmission the adjacent channel is 2.4 kHz wide, 6 dB down, and separated by 5 kHz from the transmission channel. The mixer 22 incorporates a wide bandwidth low pass filter which removes the unwanted spurious products.

After amplification, the signal from down conversion mixer 22 is filtered by a low pass filter 26 whose bandwidth is significantly less than the adjacent channel bandwidth and might be for instance 100 Hz. The output from low pass filter 26 Is fed by means of an ac coupling network 27 to a squaring circuit 28 whose output voltage $Vn^2$, is the square of its input voltage $Vn$, and the output from this measured by an integrating type of volt meter 29. The frequency of local oscillator 23 is swept by a triangular waveform generated by waveform generator 30 so that the frequency varies periodically about its nominal frequency. The output from generator 30 is also fed as a controlling signal to integrating volt meter 29 such that the output voltage from squaring circuit 28 is measured over one or more complete cycles of the local oscillator sweep wave form. The output from the volt meter is then a measure of the adjacent channel power as will be shown below, where the adjacent channel bandwidth is denoted Fc, the low pass filter bandwidth is Fl and the filter frequency is swept by total amount Fa.

Figure 7:
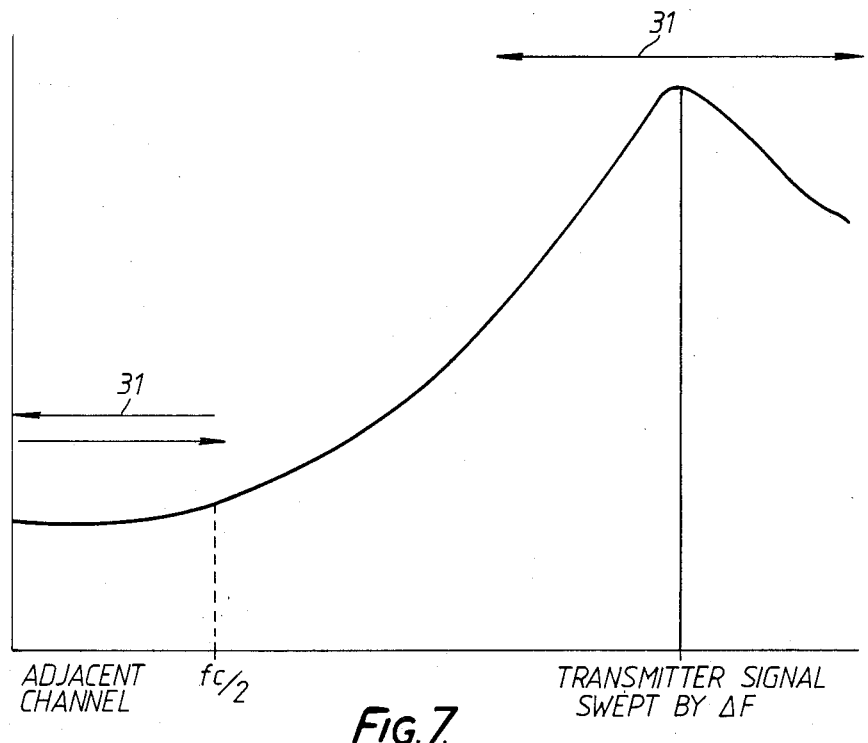
FIG. 7 shows the output spectrum of a signal having passed through the down converter mixer of FIG. 6.
Figure 8:
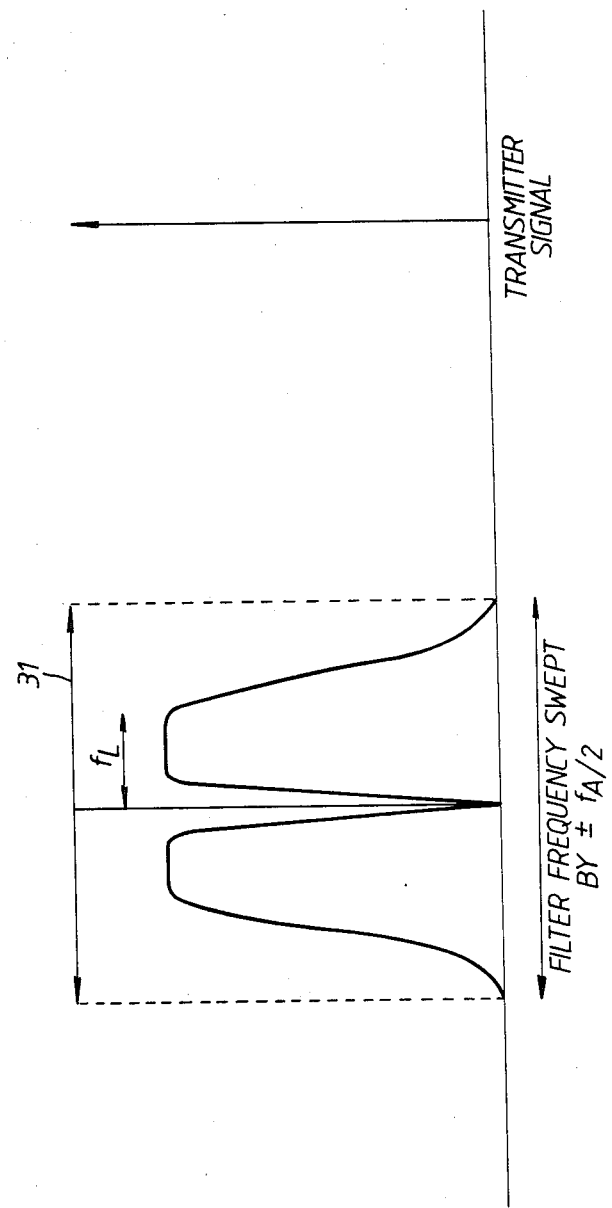
FIG. 8 shows the effective filter response of the low pass filter of FIG. 6, without frequency sweeping.
Figure 9:
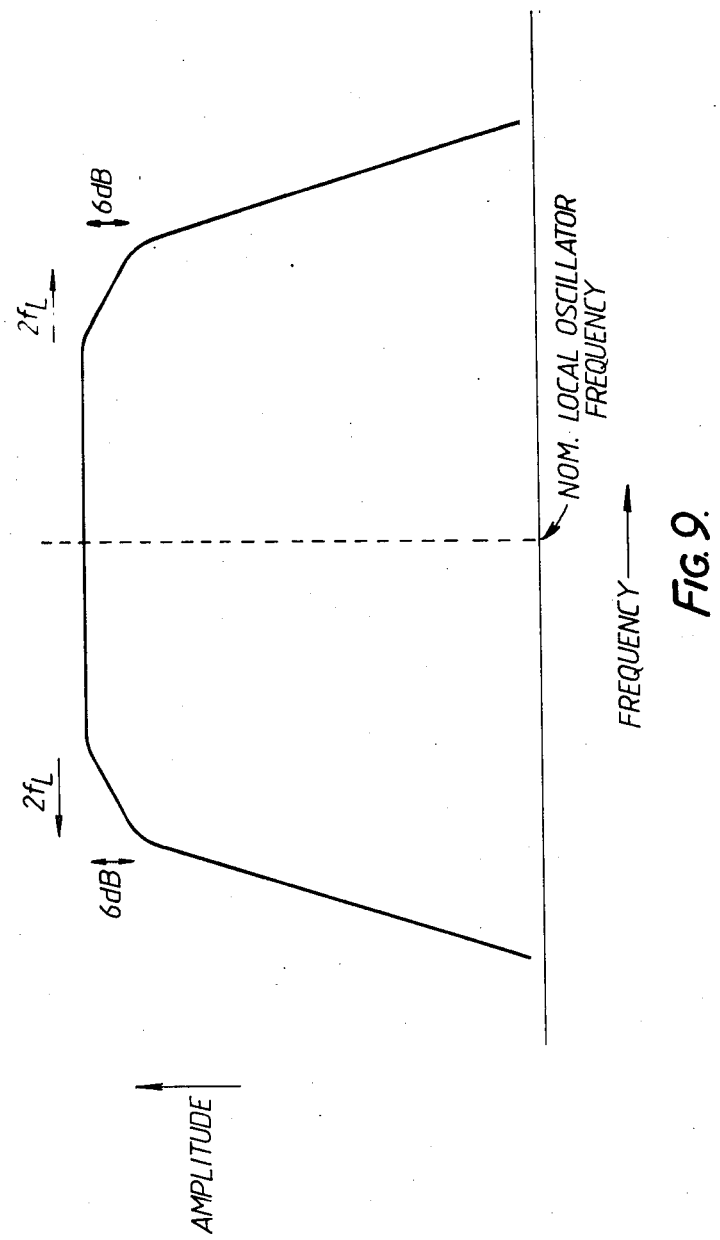
FIG. 9 shows the effective adjacent channel filter response with frequency sweeping.

The output spectrum from the down converter mixer is shown in FIG. 7, which is substantially the same as the first embodiment, shown in FIG. 3. The effect of the local oscillator sweep is shown by horizontal arrows 31 on the Figure. FIG. 8 shows the effective filter response of the low pass filter referred to the input signal spectrum, without sweeping of the local oscillator frequency. A notch is introduced in the centre of the effective filter by ac coupling networks. In the apparatus the local oscillator frequency is swept in frequency and hence the input frequency spectrum is effectively swept across the filter. The frequency sweep on either side of the nominal frequency. Fa/2, can be arranged such that the filter is swept over the entire required adjacent channel bandwidth. Thus the low pass filter 26 passes each portion of the desired adjacent channel signal in turn to squaring circuit 28 and integrating volt meter 29. These two elements convert the results to produce a measure of the power in the adjacent channel by producing a value proportional to the square of the signal voltage which is of course the fundamental definition of power in a fixed resistor.

The speed of the sweep waveform should be such that each portion of the frequency spectrum stays in the low pass filter band long enough for its amplitude to settle down. Typically, a sweep rate of around 1 KHz may be used, although the optimum rate depends upon the filter shape. This results in the overall effective filter response shown in FIG. 4. It is seen that the response is slightly reduced at its edges; this is because for one complete sweep up or down in frequency the signals towards the centre of the channel are measured twice due to the "double-sided" filter response shown in FIG. 8, but at the edge of the filter the response is lower because the spectrum is measured for a smaller amount of time.

The swept local oscillator has an effect on all the frequency components of the entire transmitter signal input to mixer 22. Hence the transmitter channel signal is also swept and in the case of a 2.4 kHz channel bandwidth with spacing of 5 kHz a signal in the transmission bandwidth can be swept down to approximately 2.6 kHz. The low pass filter must be able to reject this signal by at least 80 dB. However, this is fairly easy to achieve, and a low pass filter can be implemented fairly simply since the rate of roll off relative to the filter bandwidth is considerably less than the first mentioned embodiment above.

The system must be calibrated in order to interpret the volt meter reading. If a relative measurement is required than the transmitter power before the low pass filter, PT, can be measured If the adjacent signal power derived from the reading from volt meter 29 is measured as PA then, with no insertion loss in the filter, $$\frac{\text{adjacent channel power}}{\text{transmitter power}} = \frac{FC \times PA}{2FL \times PT}$$

The 'division by two' term appearing since the filter band width is twice the low pass filter bandwidth as shown in FIG. 8. The calculated noise bandwidth of the low pass filter should take into account any noise contained in the skirts of the filter and the effect of the ac coupling networks. If the local oscillator is swept too fast the response will be different for coherent and non-coherent signals and will hence cause measurement errors.

In this apparatus, different adjacent channel bandwidths can simply be accommodated by altering the local oscillator sweep width. The squarer and volt meter circuits 28 and 29 need to respond to lower power levels than the apparatus shown in FIG. 2 since at any time they are only measuring a fraction of the adjacent channel power. In a typical SSB system where the low pass filter band width is 100 Hz and the local channel bandwidth is 2.4 kHz then approximately ½ of the total adjacent channel power will be passed to the volt meter at any time.

What is claimed is:

1. A method for measuring adjacent channel power of a signal source spectrum including frequency shifting the spectrum such that the center frequency of the adjacent channel band is converted to DC; filtering the frequency shifted spectrum with a low pass filter; and measuring the power output from the low pass filter.

2. A method for measuring adjacent channel power of a signal source including the steps of mixing an input signal with a local oscillator signal having angle modulation and which is nominally centered on the desired adjacent channel centre frequency; filtering the frequency shifted spectrum with a low pass filter; and measuring the power output from the low pass filter by means of an a.c. coupled meter.

3. A method as claimed in claim 2 wherein the local oscillator signal is frequency or phase modulated.

4. A method as claimed in claim 2 wherein the low pass filter has a frequency response substantially equal to half the adjacent channel bandwidth.

5. A method as claimed in claim 2 wherein the local oscillator signal is modulated by a noise source.

6. A method as claimed in claim 5 wherein the noise is restricted in bandwidth and frequency.

7. A method as claimed in claim 4 further including the steps of measuring the power of the difference mixing product before low pass filtering; and comparing the results to obtain a relative value for the adjacent channel power.

8. A method as claimed in claim 2 wherein the low pass filter bandwidth is significantly less than half the adjacent channel bandwidth.

9. A method as claimed in claim 8 wherein the local oscillator frequency is swept by a periodic waveform such that parts of the desired adjacent channel frequency spectrum are passed in turn by the low pass filter.

10. A method as claimed in claim 9 wherein the periodic waveform is a triangular wave.

11. A method as claimed in claim 10 wherein the output from the low pass filter is arithmetically squared and measured over one or more complete cycles of the sweep waveform.

12. Apparatus for measuring adjacent channel power of a signal source comprising: signal input means; signal generating means for generating an angle modulated signal nominally centered on the desired adjacent channel centre frequency; means for mixing the signal input and the angle modulated signal such that the adjacent channel band is down converted to base band; a low pass filter for filtering the mixing product; and a.c. coupled means for measuring the power output from the low pass filter.

13. Apparatus as claimed in claim 12 wherein the low pass filter has a frequency response substantially equal to half the adjacent channel bandwidth.

14. Apparatus as claimed in claim 13 wherein the signal generating means comprises a local oscillator modulated by an external modulation source.

15. Apparatus as claimed in claim 14 wherein the modulation source is a noise source.

16. Apparatus as claimed in claim 12 wherein the low pass filter bandwidth is significantly less than the adjacent channel bandwidth.

17. Apparatus as claimed in claim 16 wherein the signal generating means comprises a local oscillator and a periodic waveform generator adapted to modulate the signal from the local oscillator such that parts of the desired adjacent channel frequency spectrum are passed in turn by the low pass filter.

18. Apparatus as claimed in claim 17 wherein the periodic waveform generator is a triangular waveform generator.

19. Apparatus as claimed in claim 17 further including a squarer to arithmetically square the output from the low pass filter and wherein the power output measuring means comprises an integrating type voltmeter, adapted to measure the power over one or more complete cycles of the modulating waveform.

20. Apparatus as claimed in claim 15 including means for restricting the noise source in bandwidth and frequency.

* * * * *